United States Patent
Coapes

(10) Patent No.: US 11,971,442 B2
(45) Date of Patent: Apr. 30, 2024

(54) GAS MONITORING SYSTEM FOR GAS-INSULATED SWITCHGEARS

(71) Applicant: Siemens Energy Global GmbH & Co. KG, Bayern (DE)

(72) Inventor: Graeme Coapes, Wylam (GB)

(73) Assignee: Siemens Energy Global GmbH & Co. KG, Bayern (DE)

(*) Notice: Subject to any disclaimer, the term of this patent is extended or adjusted under 35 U.S.C. 154(b) by 526 days.

(21) Appl. No.: 17/272,291

(22) PCT Filed: Aug. 28, 2019

(86) PCT No.: PCT/EP2019/072928
§ 371 (c)(1),
(2) Date: Feb. 27, 2021

(87) PCT Pub. No.: WO2020/048840
PCT Pub. Date: Mar. 12, 2020

(65) Prior Publication Data
US 2021/0341529 A1    Nov. 4, 2021

(30) Foreign Application Priority Data

Sep. 7, 2018   (EP) ..................................... 18193151
Nov. 6, 2018   (EP) ..................................... 18204735

(51) Int. Cl.
*G01R 31/12*    (2020.01)
*G01M 3/32*    (2006.01)
(Continued)

(52) U.S. Cl.
CPC .......... *G01R 31/1254* (2013.01); *G01M 3/32* (2013.01); *G01R 31/3275* (2013.01); *H02B 13/0655* (2013.01); *H02B 13/055* (2013.01)

(58) Field of Classification Search
CPC . G01R 31/1254; G01R 31/3275; G01M 3/32; H02B 13/0655; H02B 13/055; H01H 33/563; H01H 11/0062
See application file for complete search history.

(56) References Cited

U.S. PATENT DOCUMENTS 9,263,862 B2    2/2016   Kramer et al.
2012/0306656 A1*  12/2012   Boucher .............. H01H 33/563
                                                  324/424
(Continued)

FOREIGN PATENT DOCUMENTS

CN    101498754 B    8/2009
DE    3428322 A1    2/1986
(Continued)

OTHER PUBLICATIONS

Rudd S. E., et al.: "Circuit breaker prognostics using SF 6 data", Power and Energy Society General Meeting, 2011 IEEE, IEEE, pp. 1-6, XP032055624, DOI: 10.1109/PES.2011.6039599; ISBN: 978-1-4577-1000-1; pp. 3, paragraph IV; figure 1; 2011.

(Continued)

*Primary Examiner* — David Z Huang
(74) *Attorney, Agent, or Firm* — Wolter Van Dyke Davis, PLLC

(57) ABSTRACT

A gas monitoring system includes a gas-insulated switchgear, wherein the gas-insulated switch gear has at least two separated chambers which are filled with an insulating gas surrounding high or medium voltage components. A first sensor is connected to the first chamber and a second sensor is connected to the second chamber, both sensors adapted to measure a physical property of the insulating gas in their respective chambers over time. A computer unit is adapted to calculate from the two sensor measurements a leakage (Continued)

rate of the insulating gas in one of the two chambers using an adaptive filter, in particular a Wiener filter.

18 Claims, 1 Drawing Sheet

(51) Int. Cl.
*G01R 31/327* (2006.01)
*H02B 13/065* (2006.01)
*H02B 13/055* (2006.01)

(56) References Cited

U.S. PATENT DOCUMENTS

2015/0355049 A1* 12/2015 Ait Abdelmalek ... G01M 3/002
702/45
2017/0030799 A1 2/2017 Inami

FOREIGN PATENT DOCUMENTS

JP 3131501 B2 2/2001
JP 4119320 B2 7/2008

OTHER PUBLICATIONS

International search report and written opinion dated Dec. 13, 2019, for corresponding PCT/EP2019/072928.
Dangdang, Dai et al: "Leakage Region Detection of Gas Insulated Equipment by Applying Infrared Image Processing Technique"; 2017 9th International Conference On Measuring Technology and Mechatronics Automation (ICMTMA), IEEE; Jan. 14, 2017 (Jan. 14, 2017), pp. 94-98, XP033050272.

* cited by examiner

GAS MONITORING SYSTEM FOR GAS-INSULATED SWITCHGEARS

CROSS REFERENCE TO RELATED APPLICATIONS

This application is the US National Stage of International Application No. PCT/EP2019/072928 filed 28 Aug. 2019, and claims the benefit thereof. The International Application claims the benefit of European Application Nos. EP18193151 filed 7 Sep. 2018 and EP18204735 filed 6 Nov. 2018. All of the applications are incorporated by reference herein in their entirety.

FIELD OF INVENTION

The present invention relates to a gas monitoring system for gas-insulated switchgears (GIS). GIS are typically operated in the medium voltage regime (10 kV to 100 kV) and in the high voltage regime (100 kV to 1200 kV). To insulate the electrical components (e.g. disconnect switches, fuses or circuit breakers), GIS are filled with insulating gases such as air or SF6. Other gases are also used and currently under development by different manufacturers.

BACKGROUND OF INVENTION

SF6 traditionally has been the gas of choice for high voltage applications. The symmetrical arrangement of the molecule leads to extreme stability and a very high dielectric capability. It has approximately three times the dielectric strength of air at atmospheric pressure. As a result, GIS using SF6 as an insulating gas can be considerably more compact than equipment using air as the insulating medium. Further, SF6 is a "self-healing" dielectric in that it is largely undamaged by breakdown. This makes it highly suitable as an interrupting medium.

But, SF6 is also recognized as a very potent greenhouse gas. The US EPA reports that SF6 has an atmospheric lifetime of around 3200 years, and a global warming potential (100-year horizon) of 23,900 times that of CO2. Its use therefore is tightly controlled and regulated. Manufacturing defects within GIS may lead to leakage of SF6, impacting the environment and at the same time reducing the insulating performance of the GIS. When too much of the insulating gas is lost, it can have potentially catastrophic effects due to uncontrolled electric discharges.

It is a technical need to provide monitoring systems to measure the amount of insulating gas inside the GIS. Through such system, the operator is able to keep the inventory of the insulating gas usage in a given installation and produce early warning alarms to prevent failure. However, typical measurement readings of insulating gas are highly influenced by environmental conditions, such as solar radiation and temperature fluctuations. These conditions can add significant noise to the gas density measurements, which introduces errors into the measurements and increases the amount of data that is required to give a reliable measurement. Further, potential false alarms may be initiated as noise fluctuations may be interpreted as leaks.

Previously, it has been suggested to identify the leak rate of the insulating gas by using a simple linear regression algorithm. This algorithm would calculate the trend of the data from a given number of data points. It is estimated, that typically up to 28 days of data points are required in order to accurately calculate the leak rate. This would reduce the effectiveness of the system as leaks could occur before the 28 days period. Further, the linear regression algorithm does not take into consideration any environmental factors and is therefore subject to error. Such a linear regression algorithm has been described in "Circuit breaker prognostics using SF6 data" by Rudd et. al (IEEE Xplore: 10 Oct. 2011; DOI: 10.1109/PES.2011.6039599).

Therefore, it exists the need to provide a GIS system which allows a more accurate identification of the leakage rate of the insulating gas. In particular, a leakage rate identification or prediction is desired which allows a reliable determination after a relatively shorter time of measurement, in particular after not more than one day.

SUMMARY OF INVENTION

To address these problems, present invention provides for a gas monitoring system comprising a gas-insulated switchgear (GIS), wherein the gas-insulated switch gear has at least two separated chambers which are filled with an insulating gas surrounding high or medium voltage components, further comprising a first sensor connected to the first chamber and a second sensor connected to the second chamber, both sensors adapted to measure a physical property of the insulating gas in their respective chambers over time, and further comprising a computer unit adapted to calculate from the two sensor measurements a leakage rate of the insulating gas in one of the two chambers using an adaptive filter, in particular a Wiener filter.

Adaptive filters in more general terms are explained e.g. in Douglas, S. C., Introduction to Adaptive Filters, Digital Signal Processing Handbook, Ed. Vijay K. Madisetti and Douglas B. Williams, Boca Raton: CRC Press LLC, 1999; in more general terms an adaptive filter can be understood as a calculation that models the relationship between two signals in real time in an iterative manner.

Further, present invention provides for a method for calculating a leakage rate of insulating gas in a gas-insulated switchgear, wherein the gas-insulated switch gear has at least two separated chambers which are filled with an insulating gas surrounding high or medium voltage components, wherein a first physical property of the insulating gas in the first chamber is measured over time with a first sensor and a second physical property of the insulating gas in the second chamber is measured over time with a second sensor, and further calculating from the two sensor measurements a leakage rate of the insulating gas in one of the two chamber using an adaptive filter, in particular a Wiener filter.

Here, and in the following the meaning of "separated chambers" shall be construed as separated in such a way that essentially no insulating gas is exchanged between the two chambers. Both chambers can be considered gas tight and insulated against each other against gas exchange.

The medium and high voltage components of the GIS are e.g. circuit-breakers, disconnectors, etc. The person skilled in the arts understands which electrical and mechanical functional components are integrated into a GIS.

The at least two chambers of the GIS are typically having a metal housing encapsulating the medium and high voltage components.

Typical physical properties which are measured can be pressure, density, sound speed, diffraction, etc. Typically, both sensors measure the same physical property. However, in principle it is also possible that both sensors measure different properties, e.g. such as pressure and density. However, to reduce additional errors, both sensor measurements relate to the same physical property.

Present invention relies on the assumption that each gas chamber of a GIS experiences almost identical environmental conditions, and therefore the noise components within the senor measurements are comparable and to a large degree similar. This circumstance can be used effectively to "denoise" the desired measurement signal using an adaptive filter, such as e.g. a Wiener filter. However, other adaptive filter technologies also are known. The adaptive filter aims to provide a desired output signal from an input measurement signal which contains noise as explained above. The adaptive filter is able to learn the characteristics of the input measurement signal and continually updates its parameters so that it is able to produce the best possible error estimate. By subtracting this error estimate (error signal) from the input measurement signal, a clean and "denoised" signal can be retrieved. Adaptive filters differ from traditional fixed filters in that they do not need to know any prior information of the signal characteristics to work correctly.

If the error estimate signal can be removed from a measurement signal reliably, the trend over time (i.e. the leak rate or parameters which allow to calculate the leak rate) can be calculated more accurately and within a shorter time frame. Internal experiments have shown that a reliable leakage rate can be calculated from a set of data points which have been sampled over not more than a day (24 h).

Further, the noise which is typically added to a measurement signal can also introduce false alarms, as the noise might cause the measurements to exceed predefined alarm thresholds. Removal of the undesired noise using an adaptive filter will therefore also reduce the number of false alarms.

According to an aspect of the gas monitoring system the physical property of the insulating gas allows to determine the density of the insulating gas in the respective chamber. The density is a physical property which can be measured relatively easily and its tracking over time gives immediate information about the leakage rate. Further, the density also allows to keep an inventory of insulating gases which are strictly controlled and regulated.

According to another aspect of the gas monitoring system the insulating gas is SF6 or at least comprises SF6. SF6, as already explained above, is a very good dielectric gas which has very desirable "self healing" properties as a interrupting medium.

According to one more aspect of the gas monitoring system, the calculation of the leakage rate of the insulating gas includes the calculation of a predicted leakage rate for the future. Such a prediction, again, allows to keep a strict inventory on gases which are either controlled by environmental standards or which are very expensive. Further, the operator of the GIS is able to identify a future time from which onwards the operation of the GIS might become dangerous and the GIS requires servicing.

According to another aspect of the gas monitoring system, the calculation of the leakage rate of the insulating gas includes a subtraction of an estimated error signal related to the sensor measurement in the second chamber and the measured signal related to the sensor measurement in the first chamber. The subtraction allows for determination of the "denoised" and undisturbed signal. This signal again provides the desired information about the leakage rate of the insulation gas when observed over time.

According to one more aspects of the gas monitoring system, the first sensor measurement is a density measurement and the second sensor measurement is a density measurement. In other words, both measurements in both chambers are technically similar measurement. This allows for the best error subtraction by the adaptive filter as the sampled errors are relatively similar in both measurements.

According to another aspect of the gas monitoring system, the two chambers are adjacent to each other. This ensures that the measured signals both contain comparable error signals and the adaptive filter is able to provide a very clean and "denoised" signal indicating the leakage rate. Due to the local proximity, both chambers experience a comparable environment, and thus, relatively similar environmental influences (thermal and mechanical impact).

According to one more aspects of the gas monitoring system, the gas monitoring system has no temperature sensor included. The adaptive filter does not require any further information, e.g. on thermal variations, and is able to learn about the error signal in both measurement signals simply by adaptive learning routines. In this sense, present approach differs significantly from more "traditional" approaches in which the thermal influence would be verified independently by at least one or more additional sensors.

According to another aspect of the gas monitoring system, the calculation of the two sensor measurements is done for a leakage rate of the insulating gas in the first chamber and then subsequently for a leakage rate in the second chamber. Since the adaptive filter is able to make a calculation based on two measurement signals which are in principle exchangeable, the same calculation routine calculates a "denoised" and clean signal based on the assumption that one chamber leaks more strongly than the other chamber. This assumption, however, is entirely theoretical, which is why both signals can also be exchanged in this calculation, leading to the leakage rate for the other chamber.

BRIEF DESCRIPTION OF THE DRAWINGS

The above mentioned attributes and other features and advantages of this invention and the manner of attaining them will become more apparent and the invention itself will be better understood by reference to the following description of embodiments of the invention taken in conjunction with the accompanying drawings, wherein.

DETAILED DESCRIPTION OF INVENTION

Figure 1:
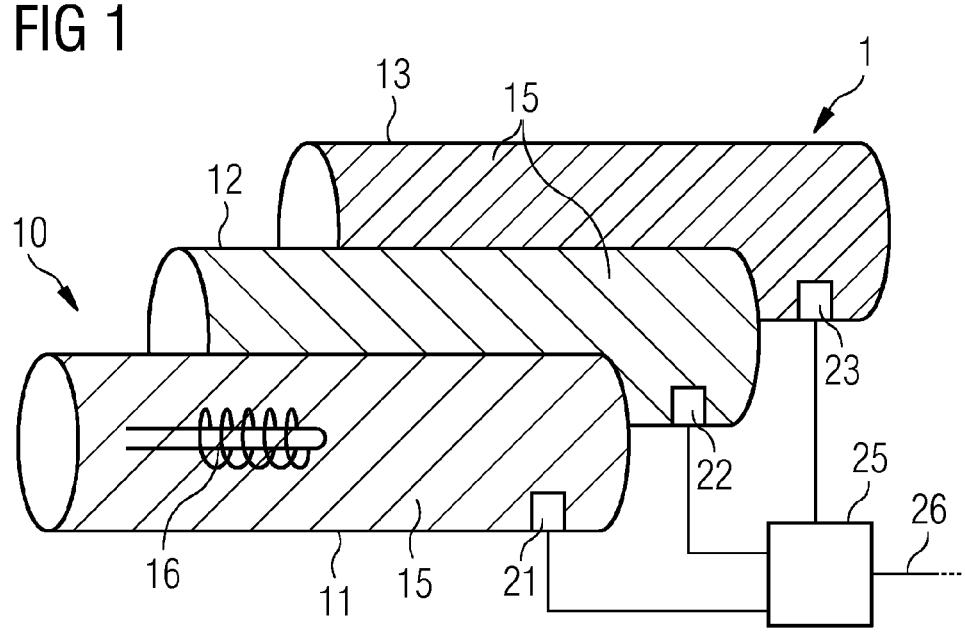
FIG. 1 shows a schematic drawing of a gas monitoring system comprising a gas-insulated switchgear according to present invention.

FIG. 1 shows a schematic drawing of a gas monitoring system (1) with a gas-insulated switchgear (10). The gas-insulated switch gear (10) has three chambers (11, 12, 13) which are filled with an insulating gas (15) surrounding high or medium voltage components (16). The three chambers (11, 12, 13) relate to the three phases of the electric voltage and each chamber (11, 12, 13) is insulated against the other ones.

The three chambers (11, 12, 13) each have one sensor (21, 22, 23) to measure a physical property of the insulating gas (15) in their respective chambers (11, 12, 13) over time. The measurement signal of each sensor (21, 22, 23) is fed into a computer unit (25) adapted to calculate from two sensor measurements a leakage rate of the insulating gas (15) in one of two chambers (11, 12, 13) using an adaptive filter, in particular a Wiener filter, and putting out the leakage rate signal through a output (26).

The skilled person understands that the three measurement signals can be combined in any form to yield two distinct measurement signals before they are fed to the computer unit (25). Alternatively, the adaptive filter might also be adapted to use three measurement signals in the calculation routine. However, in a typical case, only two signals are used in the calculation of the leakage rate of the insulating gas (15) in one of two chambers (11, 12, 13).

Figure 2:
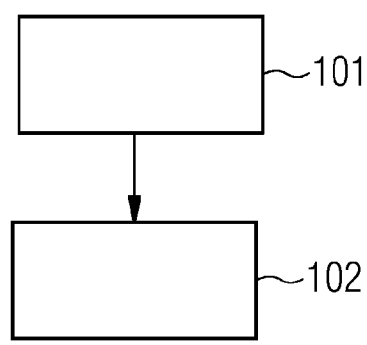
FIG. 2 shows a flow diagram which relates to an embodiment of the inventive method for calculating a leakage rate of insulating gas in a gas-insulated switchgear.

FIG. 2 shows a flow diagram which relates to an embodiment of the inventive method for calculating a leakage rate of insulating gas (15) in a gas-insulated switchgear (10). The gas-insulated switch gear (10) has at least two separated chambers (11, 12) which are filled with an insulating gas (15) surrounding high or medium voltage components (16). In a first step (101), a first physical property of the insulating gas (15) in a first chamber (11) is measured over time with a first sensor (21) and a second physical property of the insulating gas (15) in a second chamber (12) is measured over time with a second sensor (22). In a second subsequent step (102), from these two sensor measurements a leakage rate of the insulating gas (15) in one of the two chambers (21, 22) is determined using an adaptive filter, in particular a Wiener filter.

The invention claimed is:

1. A gas monitoring system comprising:
a gas-insulated switchgear, wherein the gas-insulated switch gear has at least two separated chambers including a first chamber and a second chamber which are filled with an insulating gas surrounding high or medium voltage components,
a first sensor connected to the first chamber and a second sensor connected to the second chamber, both sensors adapted to measure a physical property of the insulating gas in their respective chambers over time, and
a computer unit adapted to calculate from the two sensor measurements in the two separated chambers a leakage rate of the insulating gas in one of the two chambers and that an adaptive filter is used for the calculation.

2. The gas monitoring system pursuant to claim 1, wherein the physical property of the insulating gas allows to determine the density of the insulating gas in the respective chamber.

3. The gas monitoring system pursuant to claim 1, wherein the insulating gas is SF6.

4. The gas monitoring system pursuant to claim 1, wherein the calculation of the leakage rate of the insulating gas includes determining an error estimate signal in the two sensor measurements based on noise due to environmental conditions of the first and second chamber and calculating the leakage rate over time based on said error estimate signal.

5. The gas monitoring system pursuant to claim 1, wherein the calculation of the leakage rate of the insulating gas includes a subtraction of an estimated error signal related to the sensor measurement in the second chamber and the measured signal related to the sensor measurement in the first chamber.

6. The gas monitoring system pursuant to claim 1, wherein the first sensor measurement is a density measurement and the second sensor measurement is a density measurement.

7. The gas monitoring system pursuant to claim 1, wherein the two chambers are adjacent to each other.

8. The gas monitoring system pursuant to claim 1, wherein no temperature sensor is included in the system.

9. The gas monitoring system pursuant to claim 1, wherein the calculation of the two sensor measurements is done for a leakage rate of the insulating gas in the first chamber and then subsequently for a leakage rate in the second chamber.

10. A method for calculating a leakage rate of insulating gas in a gas-insulated switchgear, wherein the gas-insulated switch gear has at least two separated chambers including a first chamber and a second chamber which are filled with an insulating gas surrounding high or medium voltage components, the method comprising:
measuring a first physical property of the insulating gas in the first chamber over time with a first sensor and measuring a second physical property of the insulating gas in the second chamber over time with a second sensor, and
calculating from the two sensor measurements in the two separate chambers a leakage rate of the insulating gas in one of the two chambers and in that an adaptive filter is used for the calculation.

11. The gas monitoring system pursuant to claim 1, wherein the adaptive filter comprises a Wiener filter.

12. The method pursuant to claim 10, wherein the adaptive filter comprises a Wiener filter.

13. The gas monitoring system pursuant to claim 1, wherein the computer unit is adapted to calculate the leakage rate based on the two sensor measurements in the two separated chambers collected over a time of measurement of not more than 1 day.

14. The gas monitoring system pursuant to claim 5, wherein the adaptive filter is configured to subtract the error estimate signal from the sensor measurement in the first chamber and the sensor measurement in the second chamber.

15. The gas monitoring system pursuant to claim 1,
wherein the first chamber and the second chamber are adjacent to each other such that noise components in the two measurements due to environmental conditions of the first chamber and the second chamber are comparable; and
wherein the adaptive filter is configured to denoise the two sensor measurements based on determining an error estimate of the noise components in the two measurements due to the environmental conditions and subtracting the error estimate from each of the two sensor measurements.

16. The gas method pursuant to claim 10, wherein the calculating step is performed based on the two sensor measurements in the two separated chambers collected over a time of measurement of not more than 1 day.

17. The gas method pursuant to claim 10,
wherein the calculating step includes subtracting, with the adaptive filter, an estimated error signal related to the sensor measurement in the second chamber and the measured signal related to the sensor measurement in the first chamber.

18. The gas method pursuant to claim 10,
wherein the first chamber and the second chamber are adjacent to each other such that noise components in the two measurements due to environmental conditions of the first chamber and the second chamber are comparable; and wherein the method further comprises denoising, with the adaptive filter, the two sensor measurements based on determining an error estimate of the noise components in the two measurements due to the environmental conditions and subtracting the error estimate from each of the two sensor measurements.

* * * * *